(12) United States Patent
Naito et al.

(10) Patent No.: US 6,344,961 B1
(45) Date of Patent: Feb. 5, 2002

(54) MULTI-LAYER CAPACITOR, WIRING SUBSTRATE, DECOUPLING CIRCUIT, AND HIGH-FREQUENCY CIRCUIT

(75) Inventors: Yasuyuki Naito, Takefu; Masaaki Taniguchi; Yoichi Kuroda, both of Fukui-ken; Haruo Hori; Takanori Kondo, both of Sabae, all of (JP)

(73) Assignee: Murata Manufacturing Co., LTD, Kyoto (JP)

( * ) Notice: Subject to any disclaimer, the term of this patent is extended or adjusted under 35 U.S.C. 154(b) by 0 days.

(21) Appl. No.: 09/514,769

(22) Filed: Feb. 28, 2000

(30) Foreign Application Priority Data

Nov. 19, 1999 (JP) .......................... 11-329012

(51) Int. Cl.⁷ .......................... H01G 4/228; H01G 4/20
(52) U.S. Cl. ................. 361/302; 361/306.1; 361/306.3; 361/308.1; 361/309
(58) Field of Search .................. 361/302, 303, 361/306.1, 306.2, 306.3, 308.1, 308.3, 309, 311–313, 321.5

(56) References Cited

U.S. PATENT DOCUMENTS

| | | |
|---|---|---|
| 3,308,359 A | 3/1967 | Hayworth et al. |
| 3,612,963 A | 10/1971 | Piper et al. |
| 3,822,397 A | 7/1974 | Puppolo et al. |
| 3,971,970 A | 7/1976 | Voyles et al. |
| 4,074,340 A | 2/1978 | Leigh |
| 4,274,124 A | 6/1981 | Feinberg et al. |
| 4,295,183 A | 10/1981 | Miersch et al. |
| 4,328,530 A | 5/1982 | Bajorek et al. |
| 4,346,429 A | 8/1982 | DeMatos |
| 4,419,714 A | 12/1983 | Locke |
| 4,424,552 A | 1/1984 | Saint Marcoux |
| 4,430,690 A | 2/1984 | Chance et al. |
| 4,706,162 A | 11/1987 | Hernandez et al. |
| 4,814,940 A | 3/1989 | Horstmann et al. |
| 4,830,723 A | 5/1989 | Galvagni et al. |
| 4,831,494 A | 5/1989 | Arnold et al. |
| 4,852,227 A | 8/1989 | Burks |
| 4,853,826 A | 8/1989 | Hernandez |
| 4,862,318 A | 8/1989 | Galvagni et al. |
| 5,517,385 A | 5/1996 | Galvagni et al. |
| 5,880,925 A | 3/1999 | DuPre et al. |

FOREIGN PATENT DOCUMENTS

| | | |
|---|---|---|
| EP | 0 191 668 | 8/1986 |
| JP | 60-158612 | 8/1985 |
| JP | 5-205966 | 8/1993 |
| JP | 6-260364 | 9/1994 |
| JP | 7-326536 | 12/1995 |
| JP | 11-204372 | 7/1999 |

OTHER PUBLICATIONS

1991 Symposium on VLSI Technology, Digest of Technical Papers entitled Multilayer Vertical Stacked Capacitors (MVDTC) for 64 Mbit and 256 Mbit DRAMS by D. Temmler, Institute of Semiconductor Physics, Germany.

IBM Technical Disclosure Bulletin (vol.31 No. 3 Aug. 1988).

IBM Technical Disclosure Bulletin (vol.32 No. 6B Nov. 1989).

*Primary Examiner*—Anthony Dinkins
(74) *Attorney, Agent, or Firm*—Keating & Bennett, LLP

(57) ABSTRACT

A multi-layer capacitor is constructed to minimize equivalent series inductance (ESL) and includes first inner electrodes and second inner electrodes disposed opposite to each other. The first inner electrodes are electrically connected to a first outer terminal electrode via a first feed-through conductor and the second inner electrodes are electrically connected to a second outer terminal electrode via a second feed-through conductor. The first and second feed-through conductors are arranged in such a manner that magnetic fields induced by current flowing through the inner electrodes are cancelled. In addition, some of these feed-through conductors are arranged to define first and second peripheral feed-through conductors connected to the first and second inner electrodes at each periphery of the first and second inner electrodes.

40 Claims, 7 Drawing Sheets

MULTI-LAYER CAPACITATOR, WIRING SUBSTRATE, DECOUPLING CIRCUIT, AND HIGH-FREQUENCY CIRCUIT

BACKGROUND OF THE INVENTION

1. Field of the Invention

The present invention relates to multi-layer capacitors, wiring substrates, decoupling circuits, and high frequency circuits. More particularly, the present invention relates to multi-layer capacitors for use in high frequency circuits, and wiring substrates, decoupling circuits, and high frequency circuits including such multi-layer capacitors.

2. Description of the Related Art

Most conventional multi-layer capacitors are formed of ceramic dielectric materials or the like. Such multi-layer capacitors include a capacitor having a plurality of laminated dielectric layers, a plurality of pairs of mutually opposed first inner electrodes and a plurality of pairs of mutually opposed second inner electrodes alternately disposed in a direction in which the dielectric layers are laminated, the pairs of electrodes opposing via the dielectric layers so as to define a plurality of capacitor units. A first outer terminal electrode is provided on a first end surface of the capacitor, and a second outer terminal electrode is provided on a second end surface thereof. The first inner electrodes are extended out to the first end surface of the capacitor to be electrically connected to the first outer terminal electrode. In addition, the second inner electrodes are extended out to the second end surface of the capacitor to be electrically connected to the second outer terminal electrode.

In the above-described multi-layer capacitor, for example, current flows from the second outer terminal electrode to the first outer terminal electrode, and more specifically, the current flows from the second outer terminal electrode to the second inner electrode, from which the current passes through a dielectric layer to reach the first inner electrode, and then, after passing through the first inner electrode, reaches the first outer terminal electrode.

When the capacitance of a capacitor is indicated by the symbol C, an equivalent series inductance (ESL) is indicated by the symbol L, and the resistance of an electrode referred to as an equivalent series resistance (ESR) is indicated by the symbol R, an equivalent circuit of the capacitor is represented by a circuit in which the capacitance, the equivalent series inductance, and the equivalent series resistance indicated by the symbols C, L, and R, respectively, are connected in series.

In this equivalent circuit, a resonant frequency $f_o$ is equal to a value obtained by an expression $1/[2\pi \times (L \times C)^{1/2}]$, and the circuit does not function as a capacitor at frequencies higher than the resonant frequency. In other words, when a value of L, that is, the value of ESL is small, the resonant frequency $f_o$ is higher, so that the circuit can be used at higher frequencies. Although the use of copper for inner electrodes has been considered in order to reduce the value of ESR, a capacitor having a reduced ESL value is required when the capacitor is used in microwave regions.

In addition, it is also necessary to reduce the ESL value in a capacitor used as a decoupling capacitor connected to a power supply circuit supplying power to an MPU chip as a micro-processing unit contained in a work station, a personal computer, and other such electronic apparatuses including a microprocessor.

FIG. 13 is a block diagram illustrating one example of the structure in which an MPU 1 and a power supply unit 2 are connected.

In FIG. 13, the MPU 1 has a MPU chip 3 and a memory unit 4. The power supply unit 2 supplies power to the MPU chip 3. A decoupling capacitor 5 is connected to a power supply circuit from the power supply unit 2 to the MPU chip 3. In addition, a signal circuit is disposed on the side of the memory unit 4 extending from the MPU chip 3.

Similar to a typical type of decoupling capacitor, the decoupling capacitor 5 included in the above-described MPU 1 is used for absorbing noise and smoothing power-source fluctuations. Additionally, production of the MPU chip 3, having an operational frequency is over 500 MHz and up to as much as 1 GHz has been recently planned. Regarding such an MPU chip 3, in order to achieve high speed operations, it is necessary to have a fast power supplying function to supply power within a few nanoseconds, from the electrical power charged in a capacitor, when power is immediately needed, for example, during start-up.

Therefore, in the decoupling capacitor 5 used in the MPU 1, it is necessary to have as low an inductance component as possible, for instance, 10 pH or lower. Thus, a capacitor having such a low inductance is needed for such applications.

More specifically, in a certain MPU chip 3 having an operational clock frequency of approximately 500 MHz, a DC power of approximately 2.0 V is supplied, and power consumption is approximately 24 W, that is, it is designed such that a current of about 12 A flows. In order to reduce the power consumption, when an MPU 1 is not operating, a sleep mode in which the power consumption drops to 1 W or lower, is adopted. When converted from a sleep mode to an active mode, power necessary for the active mode needs to be supplied to the MPU chip 3 during the operational clock. For example, at the operational frequency of 500 MHz, when converted from the sleep mode to the active mode, power needs to be supplied within about 4 to 7 nanometer seconds.

However, since it is impossible to supply the above-described power from the power supply unit 2 in time, power is supplied to the MPU chip 3 by releasing the charge stored in the decoupling capacitor 5 disposed in proximity to the MPU chip 3 during the period of time before power from the power supply unit 2 is supplied.

When the operational clock frequency is 1 GHz, in order to satisfy such a function, the ESL value of the decoupling capacitor 5 disposed in proximity to the MPU chip 3 needs to be at least 10 pH or lower.

Since the ESL value of the aforementioned conventional multi-layer capacitor is in a range of approximately 500 pH to 800 pH, it is much higher than the value of 10 pH described above. An inductance component is generated in a multi-layer capacitor because a magnetic flux having direction determined by a direction of current flowing through the multi-layer capacitor is induced, by which a self-inductance component is generated.

Relating to the above-described background, the structures of multi-layer capacitors capable of achieving reduction in ESL are presented in, for example, Japanese Unexamined Patent Publication No. 2-256216, U.S. Pat. No. 5,880,925, Japanese Unexamined Patent Publication No. 2-159008, Japanese Unexamined Patent Publication No. 11-144996, and Japanese Unexamined Patent Publication No. 7-201651.

The aforementioned reduction in ESL is achieved mainly by cancellation of the magnetic flux induced in the multi-layer capacitor. In order to generate such a cancellation of the magnetic flux, the direction of current flowing through the multi-layer capacitor is diversified. In addition, in order to diversify the direction of current, the number of terminal electrodes disposed on an outer surface of the capacitor and the number of parts of inner electrodes extending to be electrically connected to the terminal electrodes are increased, and then, the extended parts of the inner electrodes are arranged to be oriented in various directions.

However, the above-described measures for obtaining a reduced ESL value in the multi-layer capacitor as described above are not yet effective enough.

For instance, although a structure in which the inner electrodes are extended out to the two opposing side surfaces of the capacitor is described in Japanese Unexamined Patent Publication No. 2-256216, U.S. Pat. No. 5,880,925, and Japanese Unexamined Patent Publication No. 2-159008, the ESL value can be reduced only down to approximately 100 pH.

Furthermore, in Japanese Unexamined Patent Publication No. 11-144996, although a structure in which the inner electrodes are extended out to the four side surfaces of the capacitor is described, the most effective value of ESL in this case is not lower than 40 pH.

Furthermore, in Japanese Unexamined Patent Publication No. 7-201651, although a structure in which the inner electrodes are extended out to the upper and lower main surfaces of the capacitor is described, the most effective value of ESL in this case is not lower than 50 pH.

Therefore, conventionally, in a high frequency circuit including a power supply line, which is used for an MPU chip incorporating such a multi-layer capacitor, for example, in order to obtain the ESL values of 10 pH or lower, a plurality of multi-layer capacitors connected in parallel must be mounted on a wiring substrate. As a result, an area required for mounting the multi-layer capacitors is greatly increased, which prevents a reduction in costs and size of electronic apparatuses defining such high frequency circuits.

SUMMARY OF THE INVENTION

In order to overcome the problems described above, preferred embodiments of the present invention provide a multi-layer capacitor which greatly and effectively reduces an ESL value.

In addition, preferred embodiments of the present invention provide a wiring substrate, a decoupling circuit, and a high frequency circuit including such a novel multi-layer capacitor.

According to one preferred embodiment of the present invention, there is provided a multi-layer capacitor having a capacitor main body including a plurality of laminated dielectric layers. Inside of the capacitor, at least one pair of first inner electrodes and at least one pair of second inner electrodes are disposed, the pairs of electrodes being opposed via specified dielectric layers of the plurality of the dielectric layers. First outer terminal electrodes and second outer terminal electrodes are disposed on at least one main surface extending substantially parallel to the inner electrodes in the capacitor.

Furthermore, a plurality of first feed-through conductors and a plurality of second feed-through conductors are disposed inside of the capacitor. The first feed-through conductors pass through specified dielectric layers to electrically connect the first inner electrodes and the first outer terminal electrodes such that the first feed-through conductors are electrically insulated from the second inner electrodes. In addition, the second feed-through conductors pass through specified dielectric layers to electrically connect the second inner electrodes and the second outer terminal electrodes such that the second feed-through conductors are electrically insulated from the first inner electrodes. The first and second feed-through conductors are arranged such that these feed-through conductors mutually cancel magnetic fields induced by current flowing through the inner electrodes.

In order to solve the aforementioned technical problems, the plurality of the first feed-through conductors includes first peripheral feed-through conductors connected to the first inner electrodes at the peripheries of the first inner electrodes, and the plurality of the second feed-through conductors includes second peripheral feed-through conductors connected to the second inner electrodes at the peripheries of the second inner electrodes.

Preferably, the first peripheral feed-through conductors include first peripheral feed-through conductors connected to the first inner electrodes at sides of the first inner electrodes, and the second peripheral feed-through conductors include second peripheral feed-through conductors connected to the second inner electrodes at sides of the second inner electrodes.

In addition, at least one of the first peripheral feed-through conductors and the second peripheral feed-through conductors may include peripheral feed-through conductors connected to corresponding inner electrodes at corners of the corresponding inner electrodes.

Also, the first peripheral feed-through conductors may include first peripheral feed-through conductors connected to the first inner electrodes at sides of the first inner electrodes, and the second peripheral feed-through conductors may include second peripheral feed-through conductors connected to the second inner electrodes at sides of the second inner electrodes. At the same time, at least one of the first peripheral feed-through conductors and the second peripheral feed-through conductors may include peripheral feed-through conductors connected to corresponding inner electrodes at corners of the corresponding inner electrodes.

Preferably, in the multi-layer capacitor in accordance with preferred embodiments of the present invention, the first and second outer terminal electrodes are distributed in a dotted arrangement corresponding to the first and second feed-through conductors.

In this case, preferably, a solder bump is provided at each of the first and second outer terminal electrodes.

In addition, preferably, in the multi-layer capacitor in accordance with preferred embodiments of the present invention, the first and second outer terminal electrodes are disposed only on one main surface of the main body of the capacitor. Alternatively, the first and second outer terminal electrodes may be disposed on both main surfaces thereof, or the first outer terminal electrodes may be disposed on one main surface of the capacitor and the second outer terminal electrodes may be disposed on the other main surface thereof.

The multi-layer capacitor in accordance with preferred embodiments of the present invention may be advantageously used as a decoupling capacitor connected to a power supply circuit for an MPU chip incorporated in a microprocessing unit.

According to preferred embodiment of the present invention, there is provided a wiring substrate for mounting one of the above multi-layer capacitors.

When some preferred embodiments of the present invention are applied to the wiring substrate, as one specific preferred embodiment, an MPU chip incorporated in a micro-processing unit may be mounted on the wiring substrate. In addition, the wiring substrate may have a power-supply hot-side wiring conductor supplying power for the MPU chip and a ground wiring conductor, in which one of the first outer terminal electrodes and second outer terminal electrodes used in one of the above multi-layer capacitors may be electrically connected to the power-supply hot-side wiring conductor, and the other one of the first outer terminal electrodes and the second outer terminal electrodes may be connected to the ground wiring conductor.

Preferably, the first and second outer terminal electrodes disposed in one of the above multi-layer capacitors are each connected to the wiring substrate by a bump.

According to another preferred embodiment of the present invention, there is provided a decoupling circuit including one of the multi-layer capacitors described above.

According to another preferred embodiment of the present invention, there is provided a high frequency circuit including one of the multi-layer capacitors described above.

Other features, elements, advantages and aspects of the present invention will be described in the following detailed description of preferred embodiments of the present invention with reference to the attached drawings, wherein like reference numerals indicate like elements.

BRIEF DESCRIPTION OF THE DRAWINGS

FIGS. 1A and 1B show plan views illustrating the inner structure of a multi-layer capacitor 11 according to a first preferred embodiment of the present invention, in which FIG. 1A shows a sectional surface where a first inner electrode 14 is disposed and FIG. 1B shows a sectional surface where a second inner electrode 15 is disposed;

DETAILED DESCRIPTION OF PREFERRED EMBODIMENTS

Figure 1A:
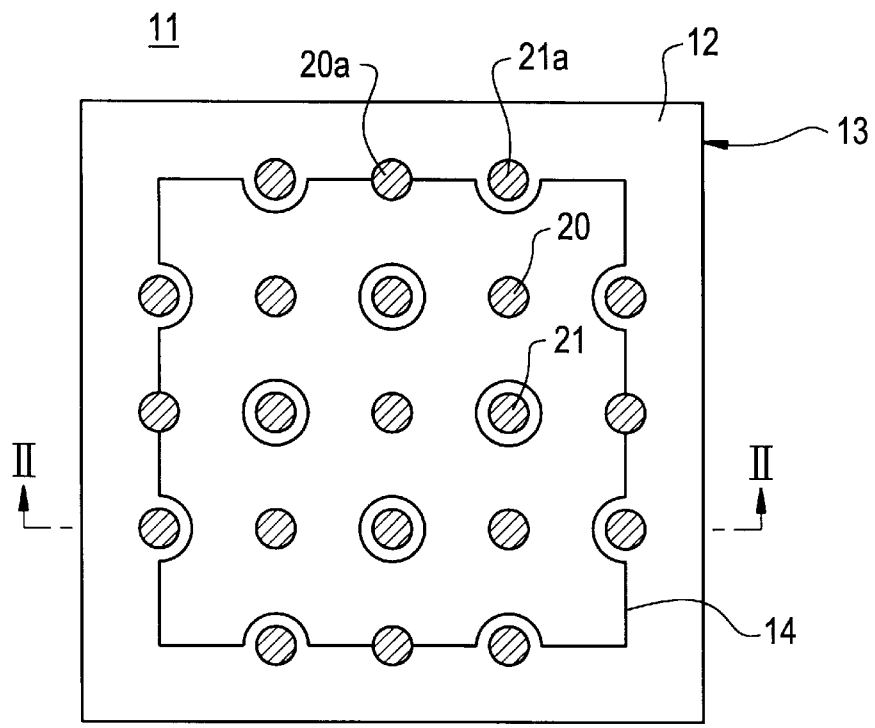
Figure 1B:
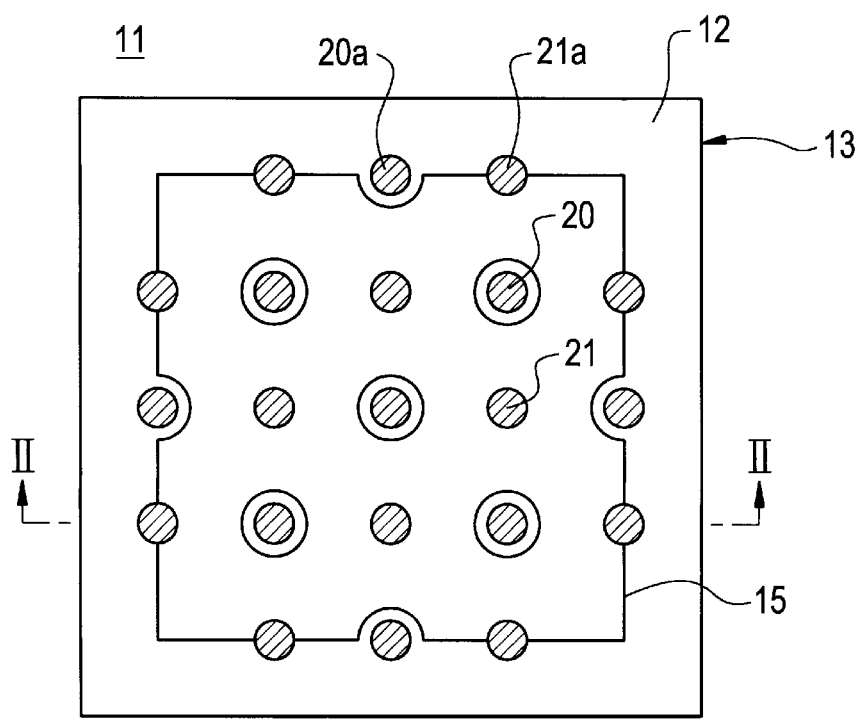
Figure 2:
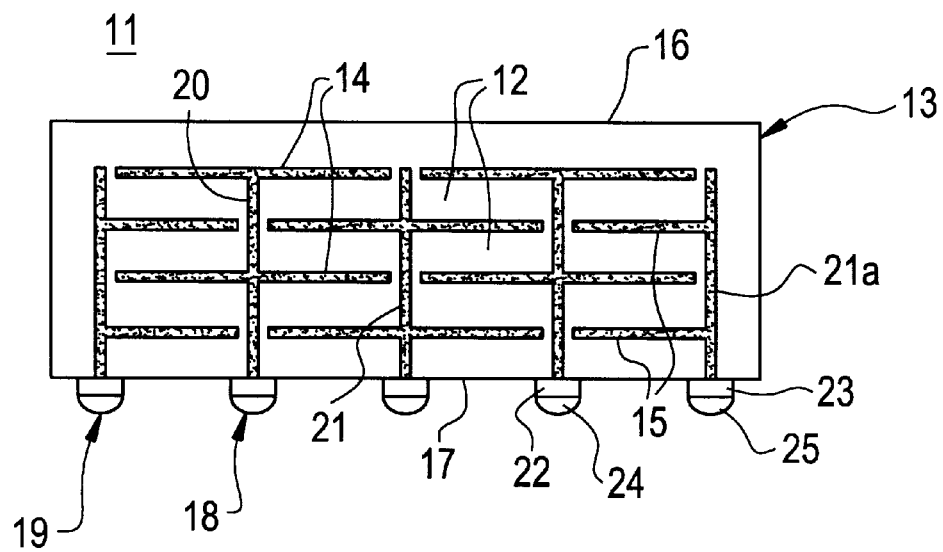
FIG. 2 is a sectional view through the line II—II shown in each of FIGS. 1A and 1B.

FIGS. 1A, 1B, and 2 each show a multi-layer capacitor 11 in accordance with a first preferred embodiment of the present invention. FIGS. 1A and 1B are plan views illustrating the inner structure of the multi-layer capacitor 11. FIGS. 1A and 1B show different sectional surfaces. In addition, FIG. 2 is a sectional view taken along a line II—II shown in each of FIGS. 1A and 1B.

The multi-layer capacitor 11 has a main body defined by a capacitor 13 including a plurality of laminated dielectric layers 12. The dielectric layers 12 are preferably made of, for example, ceramic dielectric materials or other suitable materials.

Inside the capacitor 13, at least one pair of first inner electrodes 14 and at least one pair of second inner electrodes 15 are disposed, the pairs of electrodes being mutually opposed via the dielectric layers 12. In this preferred embodiment, a plurality of the pairs of first inner electrodes 14 and a plurality of the pairs of second inner electrodes 15 are preferably provided.

In addition, a first outer terminal electrode 18 and a second outer terminal electrode 19 are disposed on at least one of main surfaces 16 and 17 of the capacitor 13, extending substantially parallel to the inner electrodes 14 and 15, that is, in this preferred embodiment, on the main surface 17.

Furthermore, inside the capacitor 13, a plurality of first feed-through conductors 20 and 20a pass through specified dielectric layers 12 to electrically connect the first inner electrodes 14 and the first outer terminal electrodes 18 such that the first feed-through conductors 20 and 20a are electrically insulated from the second inner electrodes 15. Additionally, a plurality of second feed-through conductors 21 and 21a pass through specified dielectric layers 12 to electrically connect the second inner electrodes 15 and the second outer terminal electrodes 19 such that the second feed-through conductors 21 and 21a are electrically insulated from the first inner electrodes 14.

In this preferred embodiment, as described above, the plurality of first inner electrodes 14 and the plurality of second inner electrodes 15 are disposed. In this situation, capacitances generated between the first and second inner electrodes 14 and 15 are connected in parallel by the first and second feed-through conductors 20, 20a, 21, and 21a. The capacitances connected in parallel in this way are extended out from the first and second outer terminal electrodes 18 and 19.

The first feed-through conductors 20 and 20a, and the second feed-through conductors 21 and 21a are arranged such that they mutually cancel magnetic fields induced by currents flowing through the inner electrodes 14 and 15. In other words, in this preferred embodiment, the feed-through conductors 20 and 20a, and the second feed-through conductors 21 and 21a are disposed in such a state that the feed-through conductors 20, 20a, 21, and 21a are each positioned at a corner of a substantially rectangular body, more specifically, at a corner of a substantially square-shaped body. Additionally, the first feed-through conductors 20 and 20a are each disposed adjacent to the second feed-through conductors 21 and 20a.

As the characteristic structure of various preferred embodiments of the present invention, some of the first feed-through conductors 20 and 20a are first peripheral feed-through conductors 20a connected to the first inner electrodes 14 at the peripheral portion of the first inner electrodes 14. In addition, some of the second feed-through conductors 21 and 21a are second peripheral feed-through conductors 21a connected to the second inner electrodes 15 at the peripheral portion of the second inner electrodes 15.

In addition, in this preferred embodiment, the above-described first peripheral feed-through conductors 20a are connected to the first inner electrodes 14 at the side of the first inner electrodes 14, and the second peripheral feed-through conductors 21 a are connected to the second inner electrodes 15 at the side of the second inner electrodes 15.

The first and second outer terminal electrodes 18 and 19 are disposed on a main surface 17 such that the outer terminal electrodes 18 and 19 are distributed in a dotted configuration corresponding to each of the first and second feed-through conductors 20, 20a, 21, and 20a. In this preferred embodiment, the first and second outer terminal electrodes 18 and 19 preferably include conductive pads 22 and 23, and solder bumps 24 and 25, respectively. The solder bumps 24 and 25 are provided on the pads 22 and 23.

With the multi-layer capacitor 11 having such a structure, the ESL value is greatly reduced.

Regarding the reduction in the ESL value, in order to confirm that the multi-layer capacitor 11 in accordance with preferred embodiments of the present invention has an advantageous structure, the ESL value in the multi-layer capacitor 11 was measured by a resonance method, and, as a result, a value of 18 pH was measured. In the structure of the multi-layer capacitor 11, the inner electrodes 14 and 15, and the feed-through conductors 20, 20a, 21, and 21a are preferably made of conductive paste including nickel. Furthermore, the dimensions of each of the inner electrodes 14 and 15 were approximately 4.0 mm×4.0 mm, an alignment pitch of the feed-through conductors 20, 20a, 21, and 21a was about 1.0 mm, the diameters of the feed-through conductors 20, 20a, 21, and 21a were about 0.1 mm, and the outer diameter of each insulating area disposed between the inner electrodes 14 and the feed-through conductors 21 and 21a and between the inner electrodes 15 and the feed-through conductors 20 and 20a was about 0.2 mm.

The aforementioned resonance method is a method in which the frequency characteristics of impedance of a multi-layer capacitor as a sample for the measurement is first obtained, and with a frequency $f_o$ at a minimum point in the frequency characteristics, a value of ESL is defined by $1/[(2\pi f_o)^2 \times C]$. In this case, the minimum point in the frequency characteristics is equivalent to a series resonant point between the capacitance component C and ESL of the capacitor.

Furthermore, as an example for comparison, multi-layer capacitors in accordance with the following examples 1 to 3 were produced to measure each ESL value thereof. In producing the multi-layer capacitors used in examples 1 to 3, basically, the same method as that for producing the multi-layer capacitor 11 as the above sample was used.

Although in this example the multi-layer capacitor 11 preferably has twenty-one feed-through conductors 20, 20a, 21, and 21a in total, the multi-layer capacitor used in the example 1 does not have the peripheral feed-through conductors 20a and 21a included in the multi-layer capacitor 11.

The other structural elements in the multi-layer capacitor used in the example 1 are the same as those in the multi-layer capacitor 11. The multi-layer capacitor of the example 1 preferably has nine feed-through conductors in total, which are only positioned at the center. With the multi-layer capacitor of the example 1, a high ESL value of 82 pH was obtained.

Figure 3:
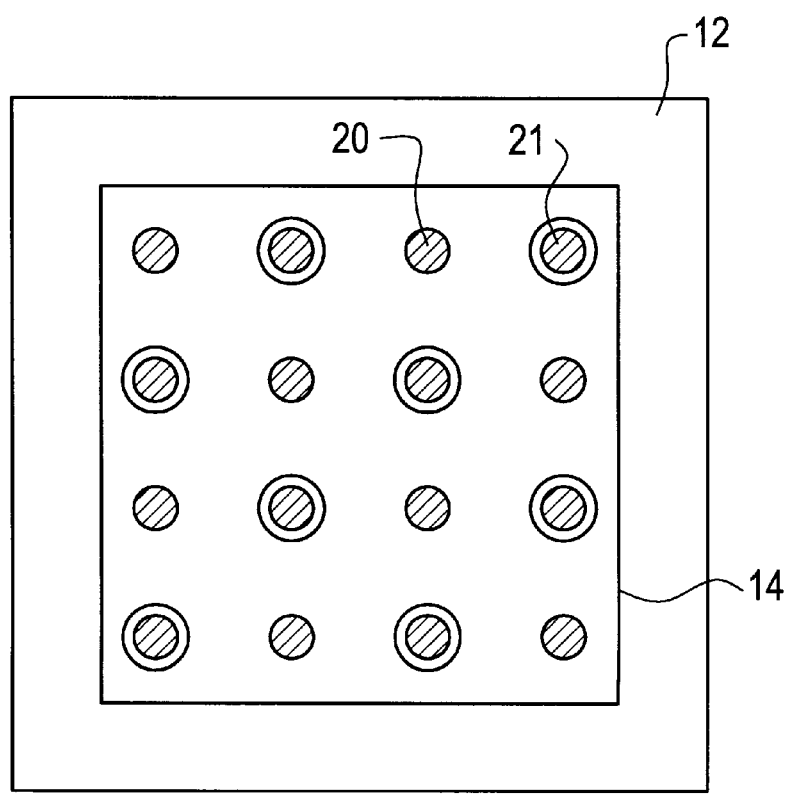
FIG. 3 is a plan view which illustrates a multi-layer capacitor prepared as a comparative example for examining the characteristics of the multi-layer capacitor 11 shown in FIGS. 1A and 1B.

In the example 2, as shown in FIG. 3, although the alignment pitch of the feed-through conductors 20 and 21 was the same as that in the case of the multi-layer capacitor 11, no peripheral feed-through conductors were disposed, with a total of sixteen feed-through conductors 20 and 21 being positioned only at the center. With the multi-layer capacitor of the example 2, a relatively high ESL value of 45 pH was obtained.

Figure 4:
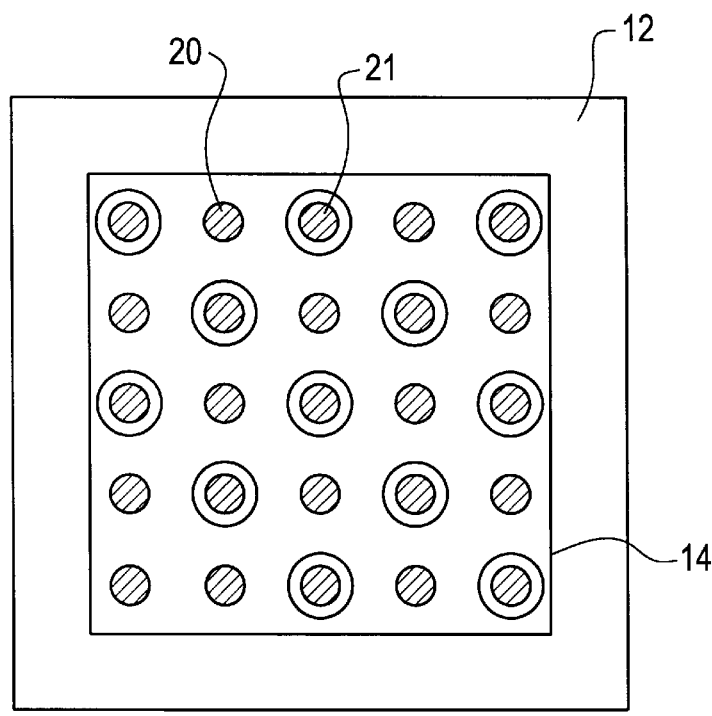
FIG. 4 is a plan view which illustrates a multi-layer capacitor prepared as another comparative example compared for examining the characteristics of the multi-layer capacitor 11 shown in FIGS. 1A and 1B.

In the example 3, as shown in FIG. 4, the alignment pitch of the feed-through conductors 20 and 21 was narrowed and a total of twenty-five feed-through conductors 20 and 21 were disposed only at the center. With the multi-layer capacitor of the example 3, a high ESL value of 28 pH was obtained. This value is higher than the ESL value of 18 pH obtained in the aforementioned multi-layer capacitor 11, although the example 3 had twenty-five feed-through conductors 20 and 21 in total, which exceeded the total number of feed-through conductors 20, 20a, 21, 21a disposed in the multi-layer capacitor 11. Therefore, in order to reduce an ESL value, it is found that it is effective to provide the peripheral feed-through conductors 20a and 21a.

Figure 5:
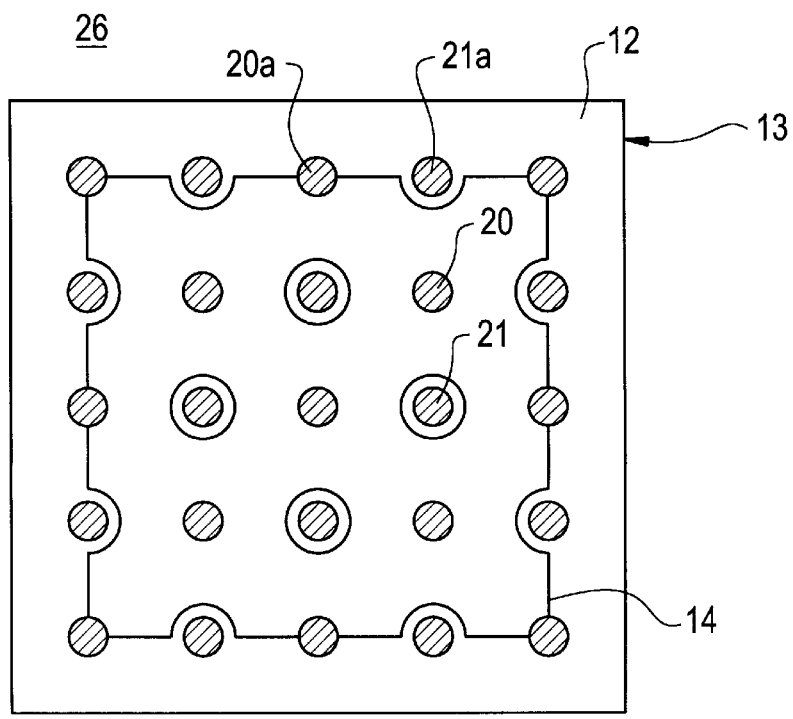
FIG. 5 is a plan view which illustrates a multi-layer capacitor 26 according to a second preferred embodiment of the present invention.

FIG. 5 shows a multi-layer capacitor 26 in accordance with a second preferred embodiment of the present invention. This view is equivalent to the view shown in FIG. 1A. In FIG. 5, the same reference numerals are used to indicate elements equivalent to those shown in FIGS. 1A and 1B, and an explanation thereof is omitted.

In the multi-layer capacitor 26 shown in FIG. 5, as peripheral feed-through conductors, a first peripheral feed-through conductor 20a and a second peripheral feed-through conductor 21a connected to a first inner electrode 14 and a second inner electrode 15, respectively, are disposed at an approximate half-way point on each side of the first and second inner electrodes 14 and 15, and the peripheral feed-through conductor 20a connected to the first inner electrode 14 is disposed at each corner of the first inner electrode 14.

As described above, with the peripheral feed-through conductor 20a at each corner of the first inner electrode 14, further reduction in the ESL value can be achieved as compared to the case of the multi-layer capacitor 11 in accordance with the first preferred embodiment. According to the aforementioned ESL-value measuring method, with the multi-layer capacitor 26, an ESL value of 15 pH was measured.

Figure 6:
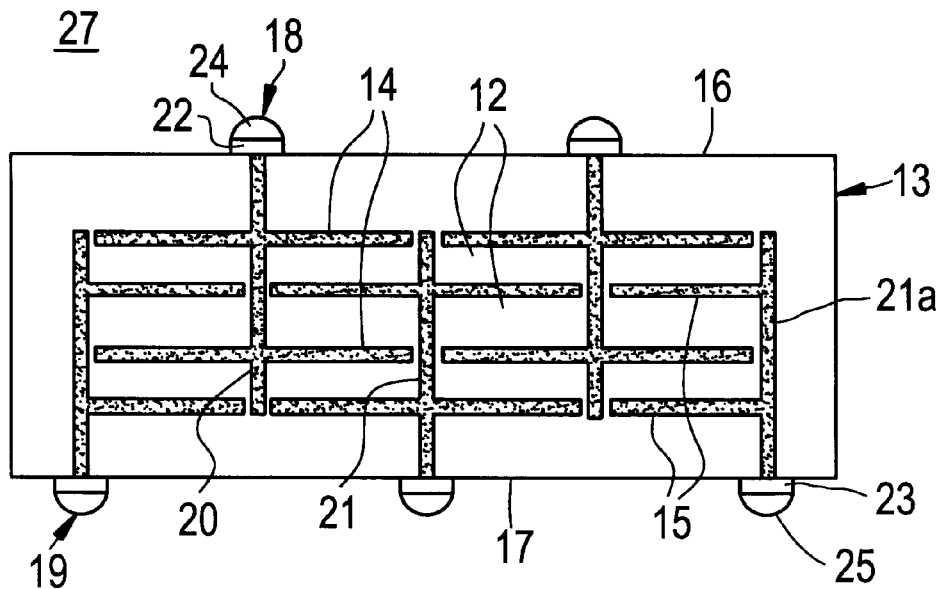
FIG. 6 is a sectional view which illustrates a multi-layer capacitor 27 according to a third preferred embodiment of the present invention.

FIG. 6 shows a multi-layer capacitor 27 in accordance with a third preferred embodiment of the present invention. This view is equivalent to the view shown in FIG. 2. In FIG. 6, the same reference numerals are used to indicate elements equivalent to those shown in FIG. 2, and an explanation thereof is omitted.

In the multi-layer capacitor 27 shown in FIG. 6, a first outer terminal electrode 18 is disposed on a main surface 16 of a capacitor 13, and a second outer terminal electrode 19 is disposed on the other main surface 17 thereof.

Figure 7:
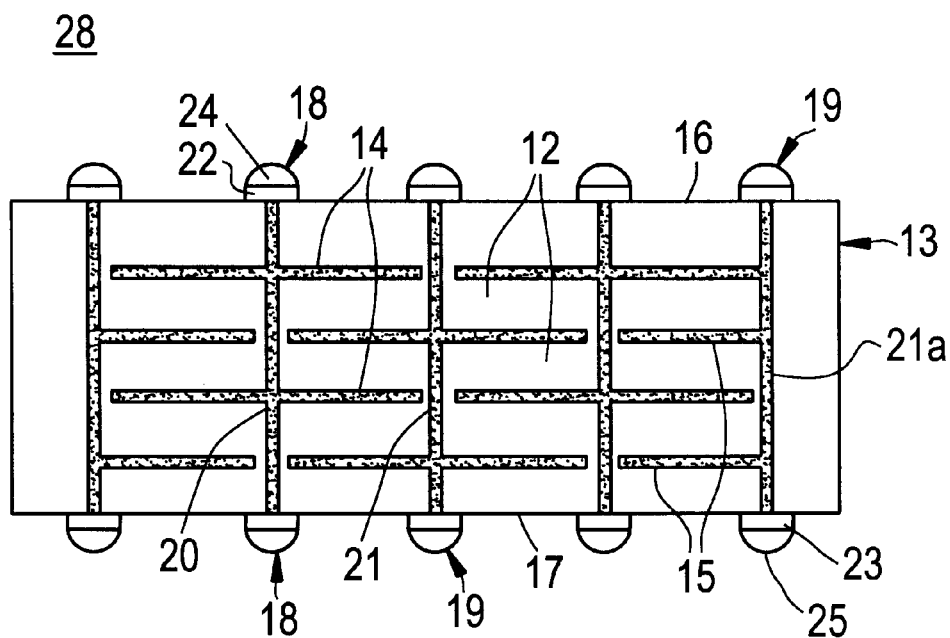
FIG. 7 is a sectional view which illustrates a multi-layer capacitor 28 according to a fourth preferred embodiment of the present invention.

FIG. 7 shows a multi-layer capacitor 28 in accordance with a fourth preferred embodiment of the present invention. This view is equivalent to the view shown in FIG. 2. In FIG. 7, the same reference numerals are used to indicate elements equivalent to those shown in FIG. 2, and an explanation thereof is omitted.

In the multi-layer capacitor 28 shown in FIG. 7, both a first outer terminal electrode 18 and a second outer terminal electrode 19 are disposed on each of two main surfaces 16 and 17 of a capacitor 13.

In the multi-layer capacitor 11 shown in FIG. 2, the flows of current, on the section shown in FIG. 2, in the first feed-through conductors 20 and 20a and the second feed-through conductors 21 and 21a, can be reversed with respect to each other. In contrast, in the multi-layer capacitor 27 shown in FIG. 6 and the multi-layer capacitor 28 shown in FIG. 7, the directions of current flowing in the first feed-through conductors 20 and 20a and the second feed-through conductors 21 and 21a are the same. Accordingly, in terms of advantages with respect to reduction in the ESL value, it is evident that the multi-layer capacitor 11 shown in FIG. 2 is more effective than the multi-layer capacitor 27 shown in FIG. 6 and the multi-layer capacitor 28 shown in FIG. 7.

Figure 8:
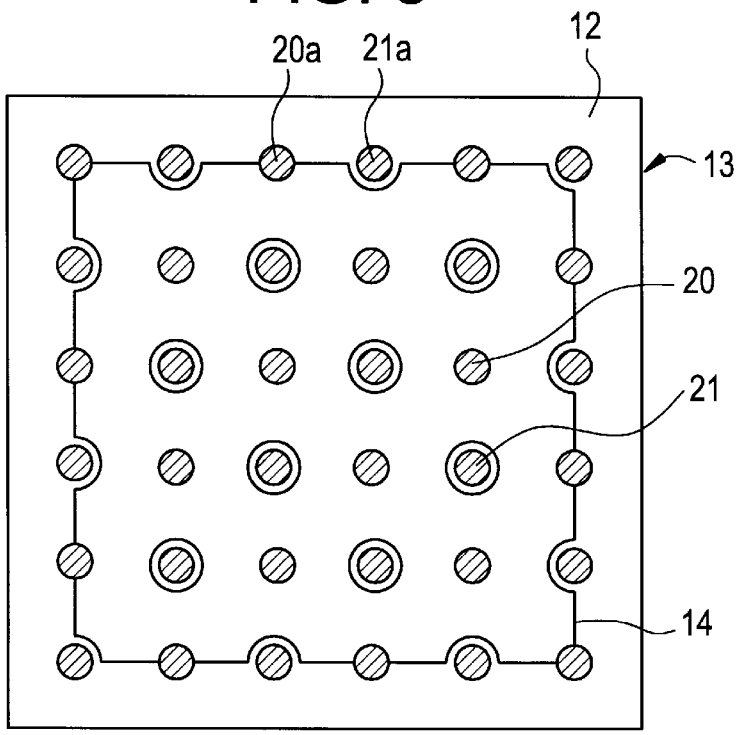
FIG. 8 is a plan view which illustrates a multi-layer capacitor 29 according to a fifth preferred embodiment of the present invention.

FIG. 8 shows a multi-layer capacitor 29 in accordance with a fifth preferred embodiment of the present invention. This view is equivalent to the view shown in FIG. 1A. In FIG. 8, the same reference numerals are used to indicate elements equivalent to those shown in FIGS. 1A and 1B, and an explanation thereof is omitted.

In the multi-layer capacitor 29 shown in FIG. 8, a total of thirty-six first feed-through conductors 20 and 20a and second feed-through conductors 21 and 21a are provided. As shown here, the number of feed-through conductors can be arbitrarily changed when it is necessary.

The multi-layer capacitor 29 has the peripheral feed-through conductors 20a and 21a at each corner of the inner electrodes 14 as in the case of the multi-layer capacitor 26 shown in FIG. 5. In this preferred embodiment using the multi-layer capacitor 29, since six peripheral feed-through conductors 20a and 21a in total are positioned on one side of each of the inner electrodes 14 and 15, among both the first and second peripheral feed-through conductors 20a and 21a, there are some feed-through conductors positioned at each corner of the inner electrodes 14 and 15. In other words, some of the first and second peripheral feed-through conductors 20a and 21a are connected to the first and second inner electrodes 14 and 15 at each corner of the inner electrodes 14 and 15.

Figure 9:
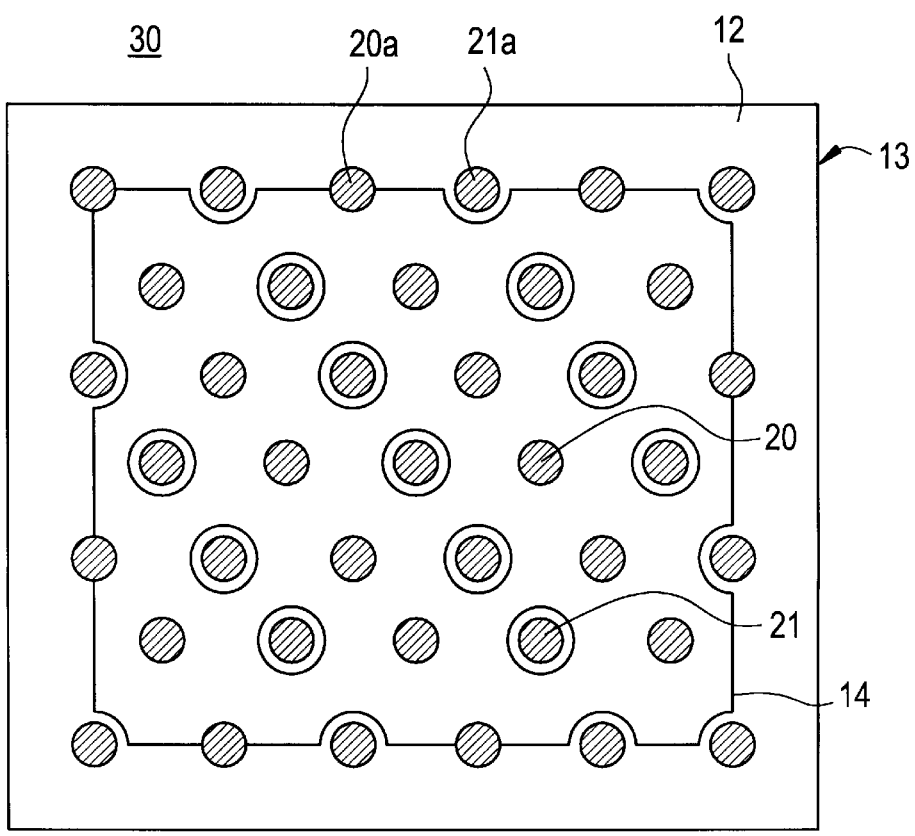
FIG. 9 is a plan view which illustrates a multi-layer capacitor 30 according to a preferred sixth preferred embodiment of the present invention.

FIG. 9 shows a multi-layer capacitor 30 in accordance with a sixth preferred embodiment of the present invention. This view is equivalent to the view shown in FIG. 1A. In FIG. 9, the same reference numerals are used to indicate elements equivalent to those shown in FIG. 1, and an explanation thereof is omitted.

In the multi-layer capacitor 30 shown in FIG. 9, first feed-through conductors 20 and 20a and second feed-through conductors 21 and 21a are arranged in such a manner that the feed-through conductors are distributed at corners of a substantially triangular form, more specifically, a regular triangle.

Regarding the preferred embodiment shown in FIG. 9, the distributed configuration adopted for arranging the feed-through conductors may be modified in other ways. For example, the configuration for positioning the feed-through conductors at each corner of a hexagon can be applied.

Figure 10:
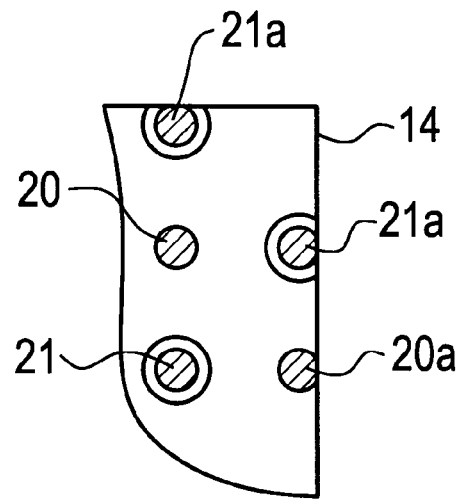
FIG. 10 is a plan view showing the positional relationships between an inner electrode 14 and feed-through conductors 20, 20a, 21, and 21a for illustrating a seventh preferred embodiment of the present invention.

FIG. 10 is a plan view illustrating the positional relationship between the inner electrodes 14 and the feed-through conductors 20, 20a, 21, and 21a in a seventh preferred embodiment of the present invention.

In the aforementioned first to sixth preferred embodiments, the peripheral feed-through conductors 20a and 21a are connected to the inner electrodes 14 and 15 at the sides of the inner electrodes 14 and 15. In this case, an arrangement of the inner electrode 15 is not shown in the figure. These peripheral feed-through conductors 20a and 21a can be positioned inside of the sides of the inner electrodes 14 and 15, as shown in FIG. 10. In the preferred embodiment shown in FIG. 10, the peripheral feed-through conductors 20a and 21a are arranged in such a manner that these peripheral feed-through conductors 20a and 21a are in contact with each side of the inner electrodes 14 and 15.

Figure 11:
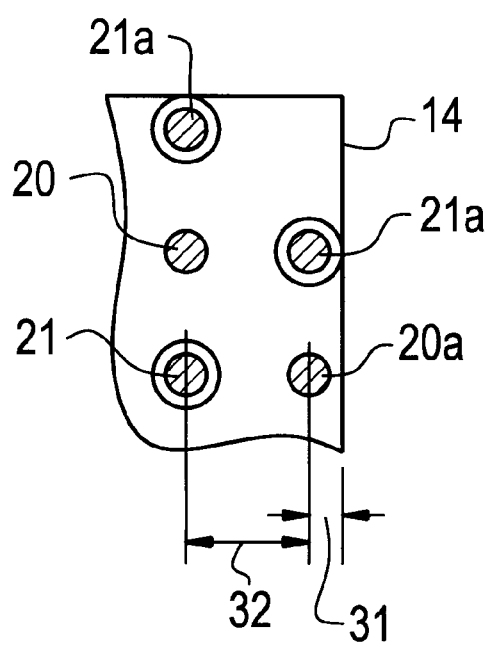
FIG. 11 is a plan view which illustrates an eighth preferred embodiment of the present invention.

FIG. 11 shows a plan view illustrating an eighth preferred embodiment of the present invention, which is equivalent to that shown in FIG. 10.

As compared to the case shown in FIG. 10, in FIG. 11, peripheral feed-through conductors 20a and 21a are positioned farther inside of the sides of the inner electrodes 14 and 15. In this situation, the arrangement of the inner electrode 15 is not shown in this figure. In this way, when the peripheral feed-through conductors 20a and 21a are positioned farther inside the sides of the inner electrodes 14 and 15, preferably, a distance 31 between each of the central portions of the peripheral feed-through conductors 20a and 21a and each side of the inner electrodes 14 and 15 is set to be about ⅓ of an alignment pitch 32 of the feed-through conductors 20, 20a, 21, and 21a, or shorter than ⅓ of the alignment pitch 32.

As described above, the multi-layer capacitor in accordance with the present invention is illustrated referring to each of the embodiments shown in the figures. However, other various modifications can be applied in terms of the numbers and positions of the inner electrodes, the outer terminal electrodes, and the feed-through conductors used in various preferred embodiments of the invention. Furthermore, the sectional configuration of the feed-through conductors should not be restricted to the rounded ones as shown in the figures. For example, a substantially quadrangular or a substantially hexagonal shape can be used as a modification.

Figure 12:
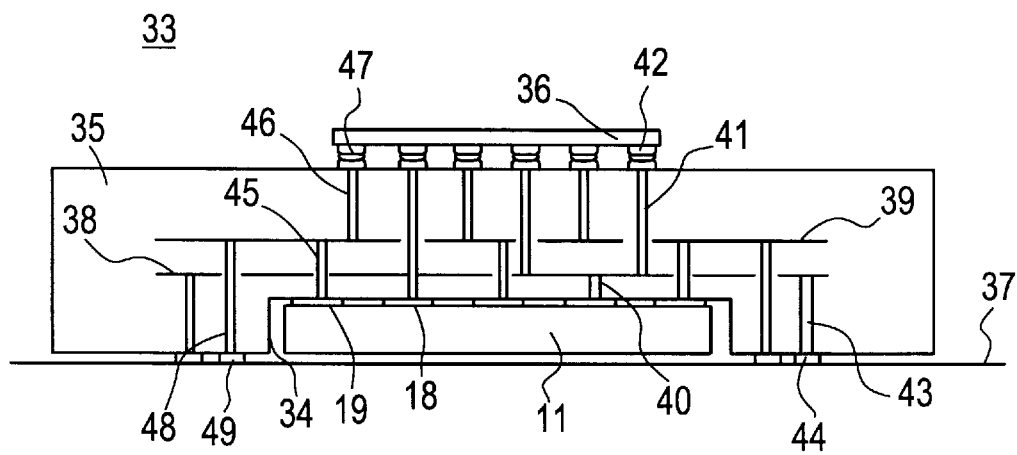
FIG. 12 is a sectional view illustrating a structural example of an MPU 33 in which the multi-layer capacitor 11 in accordance with the first preferred embodiment of the present invention is arranged to define a decoupling capacitor.
Figure 13:
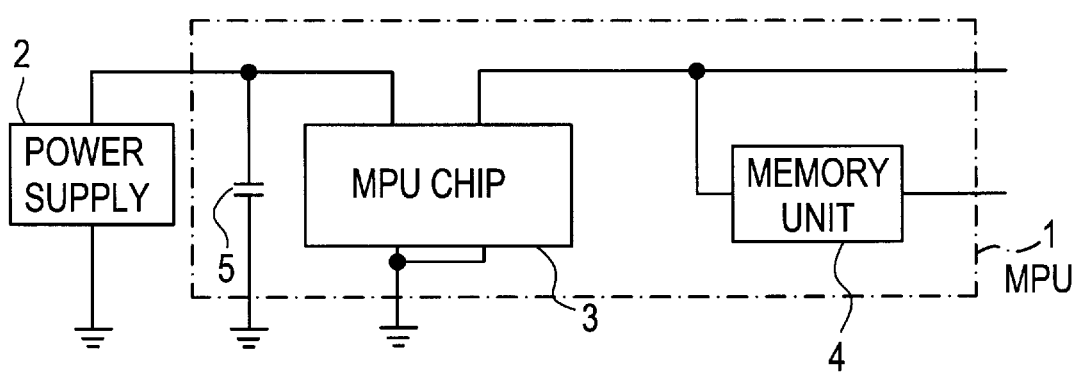
FIG. 13 is a block diagram illustrating the structure in which an MPU 1 and a power supply unit 2 are connected.

The multi-layer capacitor in accordance with preferred embodiments of the present invention, for example, can be advantageously adapted to define a decoupling capacitor 5 disposed in the aforementioned MPU 1 shown in FIG. 13. The structural example in FIG. 12 shows the structure of an MPU including the multi-layer capacitor of preferred embodiments of the present invention defining a decoupling capacitor.

Referring to FIG. 12, an MPU 33 includes a wiring substrate 35 having a multi-layered structure in which a cavity 34 is disposed on the lower surface thereof. An MPU chip 36 is surface-mounted on the upper surface of the wiring substrate 35. In addition, inside the cavity 34 of the wiring substrate 35, the multi-layer capacitor of preferred embodiments of the present invention, which defines a decoupling capacitor, is contained. For example, such a multi-layer capacitor may be the multi-layer capacitor 11 in accordance with the first preferred embodiment. Furthermore, the wiring substrate 35 is surface-mounted on a motherboard 37.

As schematically shown in the figure, wiring conductors necessary in the MPU 33 are provided on a surface of and in the inside of the wiring substrate 35. With these wiring conductors, connections as shown in FIG. 13 are obtained.

As representative ones among the wiring conductors, a power-supply hot-side electrode 38 and a ground electrode 39 are provided inside of the wiring substrate 35.

The power-supply hot-side electrode 38 is electrically connected to a first outer terminal electrode 18 of a multilayer capacitor 11 via a power-supply hot-side via-hole conductor 40 and is electrically connected to a specified terminal 42 of the MPU chip 36 via a power-supply hot-side via-hole conductor 41. Further, the power-supply hot-side electrode 38 is electrically connected to a hot-side conductive land 44 of a motherboard 37 via a power-supply hot-side via-hole conductor 43.

In addition, a ground electrode 39 is electrically connected to a second outer terminal electrode 19 of the multi-layer capacitor 11 via a ground via-hole conductor 45 and is electrically connected to a specified terminal 47 of the MPU chip 36 via a ground via-hole conductor 46. Furthermore, the ground electrode 39 is electrically connected to a ground-side conductive land 49 of the motherboard 37 via a ground via-hole conductor 48.

In the multi-layer capacitor 11 described above, the first and second outer terminal electrodes 18 and 19 are connected to the via-hole conductors 40 and 45 by bumps, although this is not shown in detail in FIG. 12.

In FIG. 12, a memory unit equivalent to the memory unit 4 shown in FIG. 13 is omitted.

As described above, according to the multi-layer capacitor in accordance with preferred embodiments of the present invention, at least one pair of first inner electrodes and at least one pair of second inner electrodes, which are mutually opposed via specified dielectric layers, are disposed inside a capacitor, as the main body, including a plurality of laminated dielectric layers. The main surfaces of the capacitor extend substantially parallel to the inner electrodes, and first outer terminal electrodes and second outer terminal electrodes are disposed on one of the main surfaces. Inside of the capacitor, a plurality of first feed-through conductors electrically connecting the first inner electrodes and the first outer terminal electrodes, and a plurality of second feed-through conductors electrically connecting the second inner electrodes and the second outer terminal electrodes are disposed. In this situation, since the first and second feed-through conductors are arranged such that the feed-through conductors mutually cancel magnetic fields induced by current flowing through the inner electrodes, current flowing through the multi-layer capacitor can be oriented in various directions and the length of current can be shortened. As a result, not only can an ESL value in the capacitor be greatly reduced, but also the effects of canceling of the magnetic fields can be applied at the peripheries of the inner electrodes, since the first and second feed-through conductors include first and second peripheral feed-through conductors, which are connected to the first and second inner electrodes, respectively, at each periphery of the first and second inner electrodes. Accordingly, a further reduction in the value of ESL can be achieved.

Therefore, a resonant frequency of the multi-layer capacitor can be higher and the frequency band in which the multi-layer capacitor defines a capacitor can be higher. The multi-layer capacitor of preferred embodiments of the present invention is sufficiently adaptable to making frequencies used in electronic circuits much higher. For example, the multi-layer capacitor of preferred embodiments of the present invention can be used as a bypass capacitor or a decoupling capacitor included in high frequency circuits.

Although a fast power supply function is required in the decoupling capacitor used by being combined with an MPU chip or other component, the multi-layer capacitor in accordance with preferred embodiments of the present invention can be sufficiently compatible with high-speed operations for the fast power-supply function, since the ESL value of the capacitor is small.

In addition, when the multi-layer capacitor of preferred embodiments of the present invention is mounted on an appropriate wiring substrate, the outer terminal electrodes included in the multi-layer capacitor can be advantageously connected by bumps. Nowadays, for example, in semiconductor chips such as MPU chips, there is a tendency to connect by bumps, as operational frequencies become higher. Disposing main-surface terminal electrodes matches this tendency. Furthermore, connection by bumps allows high-density mounting to be achieved, so that the generation of parasitic inductance in the connections can be prevented.

In the present invention, the features of each preferred embodiment described below has advantages in which canceling of the aforementioned magnetic fields is greatly improved and electrical length is greatly decreased, which leads to more effective reduction in the ESL value.

The first and second peripheral feed-through conductors include first and second peripheral feed-through conductors connected to the first and second inner electrodes, respectively, on sides of the first and second inner electrodes. Also, at least one of the first peripheral feed-through conductors and the second peripheral feed-through conductors includes peripheral feed-through conductors connected to corresponding inner electrodes at corners of the corresponding inner electrode. The first and second outer terminal electrodes are disposed only on one main surface of the capacitor.

It should be understood that the foregoing description is only illustrative of the preferred embodiments of the present invention. Various alternatives and modifications can be devised by those of skill in the art without departing from the present invention. Accordingly, the present invention is intended to embrace all such alternatives, modifications and variances which fall within the scope of the appended claims.

What is claimed is:

1. A multi-layer capacitor comprising:
    a capacitor body including a plurality of laminated dielectric layers;
    at least one pair of first inner electrodes and at least one pair of second inner electrodes, the pairs of first inner electrodes and second inner electrodes being mutually opposed via one of the plurality of the dielectric layers disposed inside of the capacitor body;
    first outer terminal electrodes and second outer terminal electrodes disposed on at least one main surface of the capacitor body, the main surface extending substantially parallel to the inner electrodes;
    a plurality of first feed-through conductors and a plurality of second feed-through conductors disposed inside of the capacitor body, the first feed-through conductors passing through specified dielectric layers of the plurality of the dielectric layers to electrically connect the first inner electrodes and the first outer terminal electrodes such state that the first feed-through conductors are electrically insulated from the second inner electrodes, and the second feed-through conductors passing through specified dielectric layers of the plurality of the dielectric layers to electrically connect the second inner electrodes and the second outer terminal electrodes in such a state that the second feed-through conductors are electrically insulated from the first inner electrodes, the first and second feed-through conductors being arranged such that the first and second feed-through conductors mutually cancel magnetic fields induced by current flowing through the inner electrodes; and first peripheral feed-through conductors included in the first feed-through conductors and second peripheral feed-through conductors included in the second feed-through conductors, the first peripheral feed-through conductors being connected to the first inner electrodes at the peripheries of the first inner electrodes, and the second peripheral feed-through conductors being connected to the second inner electrodes at the peripheries of the second inner electrodes.

2. A multi-layer capacitor according to claim 1, wherein at least one of the first peripheral feed-though conductors is connected to at least one of the first inner electrodes at a side of the first inner electrodes, and at least one of the second peripheral feed-through conductors is connected to at least one of the second inner electrodes at a side of the second inner electrodes.

3. A multi-layer capacitor according to claim 1, wherein at least one of the first peripheral feed-through conductors and the second peripheral feed-through conductors includes peripheral feed-through conductors connected to corresponding inner electrodes at corners of the corresponding inner electrodes.

4. A multi-layer capacitor according to claim 1, wherein at least one of the first peripheral feed-through conductors is connected to at least one of the first inner electrodes at a side of the first inner electrodes, and at least one of the second peripheral feed-through conductors is connected to at least one of the second inner electrodes at a side of the second inner electrodes, and at least one of the first peripheral feed-through conductors and the second peripheral feed-through conductors connected to corresponding inner electrodes at corners of the corresponding inner electrodes.

5. A multi-layer capacitor according to claim 1, wherein the first and second outer terminal electrodes are distributed in a dotted configuration corresponding to the first and second feed-through conductors.

6. A multi-layer capacitor according to claim 5, wherein a solder bump is provided at each of the first and second outer terminal electrodes.

7. A multi-layer capacitor according to claim 1, wherein the first and second outer terminal electrodes are disposed only on one main surface of the capacitor.

8. A multi-layer capacitor according to claim 1, wherein the first and second outer terminal electrodes are disposed on both main surfaces of the capacitor.

9. A multi-layer capacitor according to claim 1, wherein the first outer terminal electrodes are disposed on one main surface of the capacitor and the second outer terminal electrodes are disposed on the other main surface thereof.

10. A multi-layer capacitor according to claim 1, wherein the capacitor is arranged to define a decoupling capacitor provided in a micro-processing unit chip of a micro-processing unit.

11. A wiring substrate including a multi-layer capacitor in accordance with claim 1 mounted thereon.

12. A wiring substrate according to claim 11, wherein a micro-processing unit chip incorporated in a micro-processing unit is mounted on the wiring substrate with a power-supply hot-side wiring conductor for supplying power used for the micro-processing unit chip and a ground wiring conductor, one of the first outer terminal electrodes and the second outer terminal electrodes included in the multi-layer capacitor being electrically connected to the power-supply hot-side wiring conductor, and the other one of the first outer terminal electrodes and the second outer terminal electrodes being connected to the ground wiring conductor.

13. A wiring substrate according to claim 11, wherein the first and second outer terminal electrodes are each connected to the wiring substrate by a bump.

14. A high-frequency circuit comprising a multi-layer capacitor according to claim 1.

15. A multi-layer capacitor according to claim 1, wherein a sectional configuration of the feed-through conductors is substantially circular.

16. A multi-layer capacitor according to claim 1, wherein the first peripheral feed-through conductors and the second peripheral feed-through conductors are disposed at an approximate half-way point on each side of the first and second inner electrodes.

17. A multi-layer capacitor according to claim 1, wherein at least one of the first peripheral feed-through conductors connected to the first inner electrode is disposed at a corner of one of the first inner electrodes.

18. A multi-layer capacitor according to claim 1, wherein one of the second peripheral feed-through conductors connected to the second inner electrode is disposed at a corner of one of the second inner electrodes.

19. A multi-layer capacitor comprising:

a capacitor body including a plurality of laminated dielectric layers and having four sides;

at least one pair of first inner electrodes and at least one pair of second inner electrodes, the pairs of first inner electrodes and second inner electrodes being mutually opposed via one of the plurality of the dielectric layers disposed inside of the capacitor body and disposed at various locations in the capacitor body;

first outer terminal electrodes and second outer terminal electrodes disposed on at least one main surface of the capacitor body, the main surface extending substantially parallel to the inner electrodes;

a plurality of first feed-through conductors and a plurality of second feed-through conductors disposed inside of the capacitor body, the first feed-through conductors passing through specified dielectric layers of the plurality of the dielectric layers to electrically connect the first inner electrodes and the first outer terminal electrodes such state that the first feed-through conductors are electrically insulated from the second inner electrodes, and the second feed-through conductors passing through specified dielectric layers of the plurality of the dielectric layers to electrically connect the second inner electrodes and the second outer terminal electrodes in such a state that the second feed-through conductors are electrically insulated from the first inner electrodes;

wherein the first and second feed-through conductors extend from the first and second outer terminal electrodes, respectively, along a major portion of the plurality of dielectric layers, and the first and second feed-through conductors are arranged such that the first and second feed-through conductors mutually cancel magnetic fields induced by current flowing through the inner electrodes.

20. A multi-layer capacitor according to claim 19, wherein each of the first outer terminals is located adjacent to one of the second outer terminals along the at least one major surface of the capacitor body.

21. A multi-layer capacitor according to claim 19, wherein each of the first feed-through conductors is located adjacent to one of the second feed-through conductors within the capacitor body.

22. A multi-layer capacitor according to claim 19, wherein the first outer terminals have a first polarity and the second outer terminals have a second polarity opposite to the first polarity.

23. A multi-layer capacitor according to claim 19, further comprising first peripheral feed-through conductors included in the first feed-through conductors and second peripheral feed-through conductors included in the second feed-through conductors, the first peripheral feed-through conductors being connected to the first inner electrodes at the peripheries of the first inner electrodes, and the second peripheral feed-through conductors being connected to the second inner electrodes at the peripheries of the second inner electrodes.

24. A multi-layer capacitor according to claim 23, wherein at least one of the first peripheral feed-though conductors is connected to at least one of the first inner electrodes at a side of the first inner electrodes, and at least one of the second peripheral feed-through conductors is connected to at least one of the second inner electrodes at a side of the second inner electrodes.

25. A multi-layer capacitor according to claim 23, wherein at least one of the first peripheral feed-through conductors and the second peripheral feed-through conductors includes peripheral feed-through conductors connected to corresponding inner electrodes at corners of the corresponding inner electrodes.

26. A multi-layer capacitor according to claim 23, wherein at least one of the first peripheral feed-through conductors is connected to at least one of the first inner electrodes at a side of the first inner electrodes, and at least one of the second peripheral feed-through conductors is connected to at least one of the second inner electrodes at a side of the second inner electrodes, and at least one of the first peripheral feed-through conductors and the second peripheral feed-through conductors connected to corresponding inner electrodes at corners of the corresponding inner electrodes.

27. A multi-layer capacitor according to claim 19, wherein the first and second outer terminal electrodes are distributed in a dotted configuration corresponding to the first and second feed-through conductors.

28. A multi-layer capacitor according to claim 27, wherein a solder bump is provided at each of the first and second outer terminal electrodes.

29. A multi-layer capacitor according to claim 19, wherein the first and second outer terminal electrodes are disposed only on one main surface of the capacitor.

30. A multi-layer capacitor according to claim 19, wherein the first and second outer terminal electrodes are disposed on both main surfaces of the capacitor.

31. A multi-layer capacitor according to claim 19, wherein the first outer terminal electrodes are disposed on one main surface of the capacitor and the second outer terminal electrodes are disposed on the other main surface thereof.

32. A multi-layer capacitor according to claim 19, wherein the capacitor is arranged to define a decoupling capacitor provided in a micro-processing unit chip of a micro-processing unit.

33. A wiring substrate including a multi-layer capacitor in accordance with claim 19 mounted thereon.

34. A wiring substrate according to claim 33, wherein a micro-processing unit chip incorporated in a micro-processing unit is mounted on the wiring substrate with a power-supply hot-side wiring conductor for supplying power used for the micro-processing unit chip and a ground wiring conductor, one of the first outer terminal electrodes and the second outer terminal electrodes included in the multi-layer capacitor being electrically connected to the power-supply hot-side wiring conductor, and the other one of the first outer terminal electrodes and the second outer terminal electrodes being connected to the ground wiring conductor.

35. A wiring substrate according to claim 33, wherein the first and second outer terminal electrodes are each connected to the wiring substrate by a bump.

36. A high-frequency circuit comprising a multi-layer capacitor according to claim 19.

37. A multi-layer capacitor according to claim 19, wherein a sectional configuration of the feed-through conductors is substantially circular.

38. A multi-layer capacitor according to claim 23, wherein the first peripheral feed-through conductors and the second peripheral feed-through conductors are disposed at an approximate half-way point on each side of the first and second inner electrodes.

39. A multi-layer capacitor according to claim 23, wherein at least one of the first peripheral feed-through conductors connected to the first inner electrode is disposed at a corner of one of the first inner electrodes.

40. A multi-layer capacitor according to claim 23, wherein one of the second peripheral feed-through conductors connected to the second inner electrode is disposed at a corner of one of the second inner electrodes.

* * * * *